(12) United States Patent
Miura

(10) Patent No.: US 11,095,241 B2
(45) Date of Patent: Aug. 17, 2021

(54) MOTOR CONTROL DEVICE AND MOTOR CONTROL METHOD

(71) Applicants: Kabushiki Kaisha Toshiba, Tokyo (JP); Toshiba Electronic Devices & Storage Corporation, Tokyo (JP)

(72) Inventor: Tsukasa Miura, Zushi Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 154 days.

(21) Appl. No.: 16/567,809

(22) Filed: Sep. 11, 2019

(65) Prior Publication Data

US 2020/0295690 A1    Sep. 17, 2020

(30) Foreign Application Priority Data

Mar. 14, 2019  (JP) .............................. JP2019-047496

(51) Int. Cl.
| | |
|---|---|
| *H02P 21/22* | (2016.01) |
| *H02K 19/10* | (2006.01) |
| *H02P 8/12* | (2006.01) |
| *H03K 17/687* | (2006.01) |
| *H02M 7/5387* | (2007.01) |
| *H02K 3/04* | (2006.01) |

(52) U.S. Cl.
CPC ............... *H02P 21/22* (2016.02); *H02K 3/04* (2013.01); *H02K 19/10* (2013.01); *H02M 7/5387* (2013.01); *H02P 8/12* (2013.01); *H03K 17/687* (2013.01); *H03K 2217/0027* (2013.01)

(58) Field of Classification Search
CPC ............. H02P 21/22; H02P 8/12; H02K 3/04; H02K 19/10; H02M 7/5387; H03K 17/687; H03K 2217/0027
See application file for complete search history.

(56) References Cited

U.S. PATENT DOCUMENTS

| | | | |
|---|---|---|---|
| 8,847,522 B2 | 9/2014 | Nashiki et al. | |
| 2011/0273119 A1* | 11/2011 | Fricker | ..................... H02P 6/06 |
| | | | 318/400.04 |
| 2012/0043919 A1* | 2/2012 | Lee | ......................... H02P 6/181 |
| | | | 318/400.11 |

FOREIGN PATENT DOCUMENTS

| | | |
|---|---|---|
| JP | H11-18398 A | 1/1999 |
| JP | 2010-69293 A | 4/2010 |
| JP | 2010-268632 A | 11/2010 |
| JP | 2014-158357 A | 8/2014 |

* cited by examiner

*Primary Examiner* — Zoheb S Imtiaz
(74) *Attorney, Agent, or Firm* — White & Case LLP

(57) ABSTRACT

According to one embodiment, there is provided a motor control device including a detection circuit, a control circuit and a drive circuit. The detection circuit detects, in a direct current motor with a first coil and second coil, a first parameter related to an induced voltage generated in the first coil and a second parameter related to an induced voltage generated in the second coil. The control circuit changes, according to a difference between the first parameter and the second parameter, at least one of a first amplitude control value of a current of the first coil and a second amplitude control value of a current of the second coil. The drive circuit drives, according to the changed amplitude control value, the first coil and the second coil, respectively.

16 Claims, 7 Drawing Sheets

MOTOR CONTROL DEVICE AND MOTOR CONTROL METHOD

CROSS-REFERENCE TO RELATED APPLICATIONS

This application is based upon and claims the benefit of priority from Japanese Patent Application No. 2019-047496, filed on Mar. 14, 2019; the entire contents of which are incorporated herein by reference.

FIELD

Embodiments described herein relate generally to a motor control device and a motor control method.

BACKGROUND

It is desirable that a control device for a direct current (DC) motor control a current to properly drive the DC motor. Ideally, in a DC motor M, it is possible to obtain rotation with suppressed 'motor vibration'/'drive noise' by applying a current controlled in a sine wave shape with identical amplitude to each winding. For example, micro-step excitation control where a current in a sine wave shape with identical amplitude is applied to each winding to rotate a motor is effective to suppress 'motor vibration'/'drive noise'. In order to achieve a more ideal sine wave, 'motor vibration'/'drive noise' is suppressed by improving current step resolution or improving accuracy of motor current control.

However, there are variations in angular accuracy that is a cause of variations in manufacturing. In this case, even if a current controlled in an ideal sine wave shape is applied to each winding, it is difficult to obtain smooth rotation due to variations in angular accuracy, and it is hard to completely suppress motor vibration/drive noise. On the other hand, as a measure against motor vibration/drive noise, there is a method for correcting a current and improving angular accuracy by using a highly accurate encoder device, but a system tends to be complicated, and manufacturing costs may increase.

DETAILED DESCRIPTION

In general, according to one embodiment, there is provided a motor control device including a detection circuit, a control circuit and a drive circuit. The detection circuit detects, in a direct current motor with a first coil and second coil, a first parameter related to an induced voltage generated in the first coil and a second parameter related to an induced voltage generated in the second coil. The control circuit changes, according to a difference between the first parameter and the second parameter, at least one of a first amplitude control value of a current of the first coil and a second amplitude control value of a current of the second coil. The drive circuit drives, according to the changed amplitude control value, the first coil and the second coil, respectively.

Exemplary embodiments of a motor control device will be explained below in detail with reference to the accompanying drawings. The present invention is not limited to the following embodiments.

Embodiments

Figure 1:
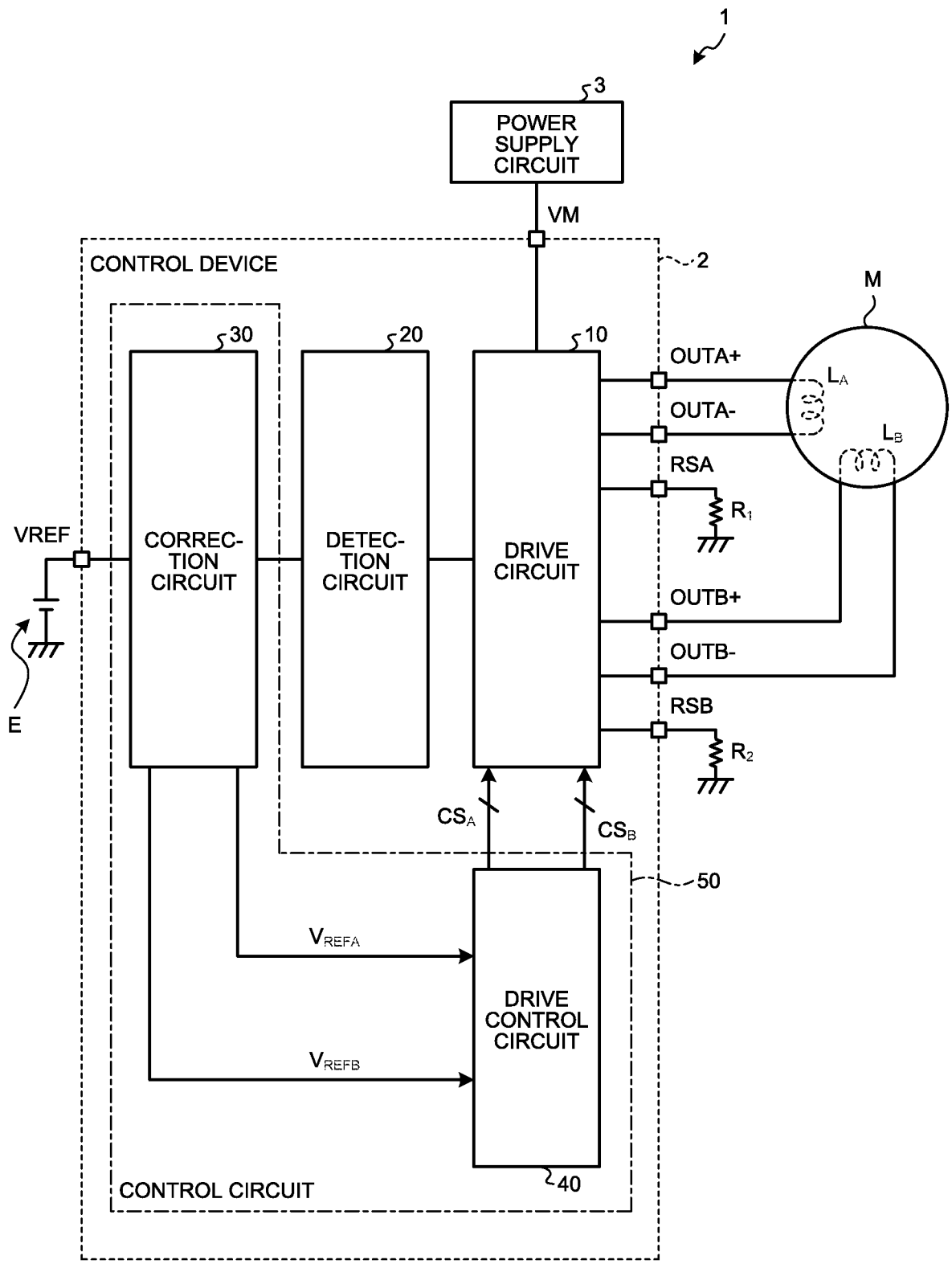
FIG. 1 is a configuration diagram of a motor control system according to an embodiment.

FIG. 1 is a configuration diagram of a motor control system 1 according to the present embodiment. The motor control system 1 performs drive control of a DC motor M. The DC motor M is, for example, a stepping motor. The DC motor M has multiphase windings (a plurality of coils). The following exemplifies a case where the DC motor M has two-phase (A-phase and B-phase) windings, but the present embodiment is also applicable to a case where the DC motor M has three or more multiphase windings.

The motor control system 1 performs, in an initial setting period such as during power source activation, feedback control on the multiphase windings and sets amplitude control values of currents to be unbalanced with each other. In other words, the motor control system 1 supplies a current to a winding in each phase and detects a parameter related to an induced voltage generated. Through this parameter detection, the motor control system 1 measures variations in angular accuracy and purposely sets amplitude control values of currents to be unbalanced so as to cancel a difference between multiphase parameters. Then, the motor control system 1 performs, during a normal operation period, feedforward control of the currents using the set amplitude control values. As a result, the motor control system 1 can, during a normal operation period, offset an influence of variations in angular accuracy, obtain smooth rotation, and suppress 'motor vibration'/'drive noise'.

The motor control system 1 of FIG. 1 includes a control device 2 and a power supply circuit 3. The control device 2 is connected to the power supply circuit 3 and the DC motor M and controls a drive of the DC motor M. The DC motor M has a rotor (not illustrated) including a plurality of magnetic poles, and a stator including a winding $L_A$ of an A-phase (first coil) and a winding $L_B$ of a B-phase (second coil).

The control device 2 has a drive circuit 10, a detection circuit 20, and a control circuit 50. A configuration where the drive circuit 10, the detection circuit 20, and the control circuit 50 are included is implemented as a micro controller unit (MCU) or an analog circuit. The control device 2 has, as terminals for external connection, a terminal VM, a terminal VREF, a terminal OUTA+, a terminal OUTA−, a terminal OUTB+, a terminal OUTB−, a terminal RSA, a terminal RSB, and a terminal GND.

The drive circuit 10 supplies currents $I_A$ and $I_B$ to the windings $L_A$ and $L_B$, respectively. The detection circuit 20 detects, according to a physical quantity related to an induced voltage generated in each of the windings $L_A$ and $L_B$, a parameter $PM_A$ (first parameter) and a parameter $PM_B$ (second parameter). A physical quantity related to an induced voltage may be, for example, a rate of change when a current flowing through a winding reaches a predetermined value (e.g., a target current value at a 90° phase timing in each phase) from substantially zero or may be a voltage generated in a winding during a period when a target current of a winding is substantially zero. The detection circuit 20 supplies the parameters $PM_A$ and $PM_B$ to the control circuit 50.

The control circuit 50 generates control signals $CS_A$ and $CS_B$ according to a difference between the parameters $PM_A$ and $PM_B$ and controls the drive circuit 10. The control circuit 50 is connected to an external voltage source E, or a reference voltage $V_{REF}$, via the terminal VREF. FIGS. 2A, 2B, 3A, and 3B are waveform diagrams illustrating the correcting operations according to the embodiment. In the control circuit 50, control waveform patterns $CW_A$ and $CW_B$ are set in advance or generated from square waveforms through calculation using predetermined parameters. The control waveform patterns $CW_A$ and $CW_B$ have waveforms with maximum amplitudes substantially equal to each other and phases shifted from each other by substantially 90°. The control waveform patterns $CW_A$ and $CW_B$ indicate target currents of the windings $L_A$ and $L_B$.

The control circuit 50 generates, using the reference voltage VREF and the control waveform patterns $CW_A$ and $CW_B$, an amplitude control value $V_{REFA}$ of a current of the winding $L_A$ and an amplitude control value $V_{REFB}$ of a current of the winding $L_B$. For example, the control circuit 50 has conversion factors proportional to amplitudes in the control waveform patterns $CW_A$ and $CW_B$, that is, conversion factors corresponding to control timings. The control circuit 50 multiplies the reference voltage VREF by the conversion factors to obtain the amplitude control values $V_{REFA}$ and $V_{REFB}$.

The control circuit 50 has a correction circuit 30 and a drive control circuit 40. The correction circuit 30 unbalances amplitudes of the target currents of the windings $L_A$ and $L_B$ with each other. The correction circuit 30 corrects, according to a difference between the parameters $PM_A$ and $PM_B$, at least one of the amplitude control value $V_{REFA}$ and $V_{REFB}$. For example, when the control device 2 performs control based on the A-phase, the correction circuit 30 corrects, while maintaining the amplitude control value $V_{REFA}$, the amplitude control value $V_{REFB}$ in a direction where a difference between the parameters $PM_A$ and $PM_B$ decreases. The amplitude control values $V_{REFA}$ and $V_{REFB}$ each correspond to amplitudes of target voltages of current determination nodes, corresponding to the amplitudes of the target currents of the windings $L_A$ and $L_B$.

Figure 2A:
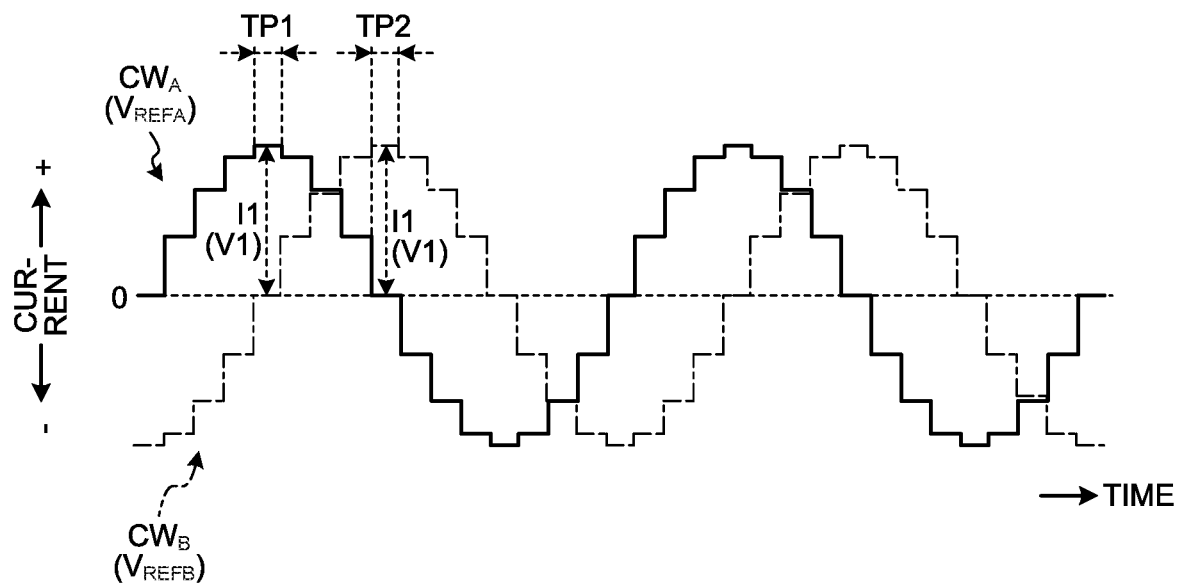
FIGS. 2A and 2B are waveform diagrams illustrating a correcting operation (when increasing an amplitude) according to the embodiment.
Figure 2A:
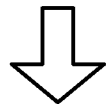
Figure 2B:
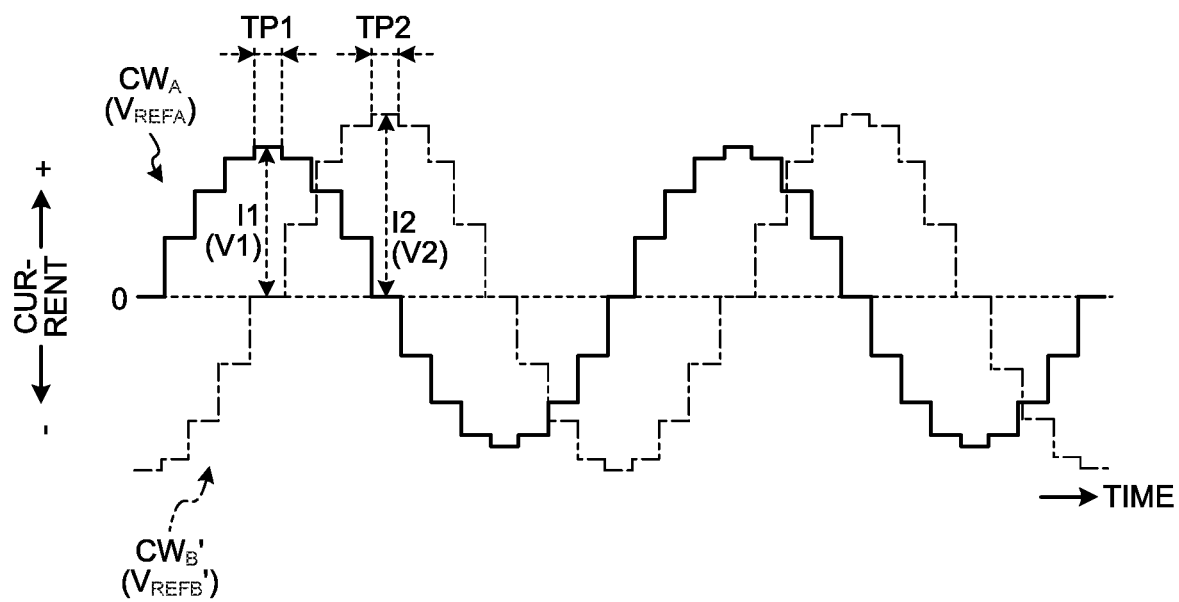
Figure 3A:
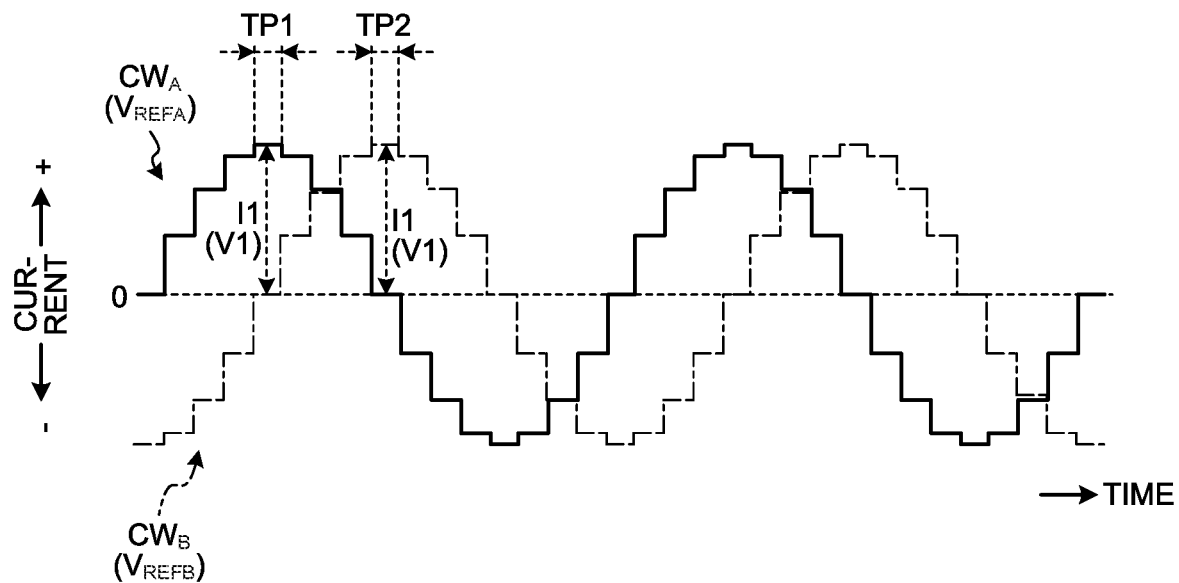
FIGS. 3A and 3B are waveform diagrams illustrating a correcting operation (when decreasing an amplitude) according to the embodiment.
Figure 3B:
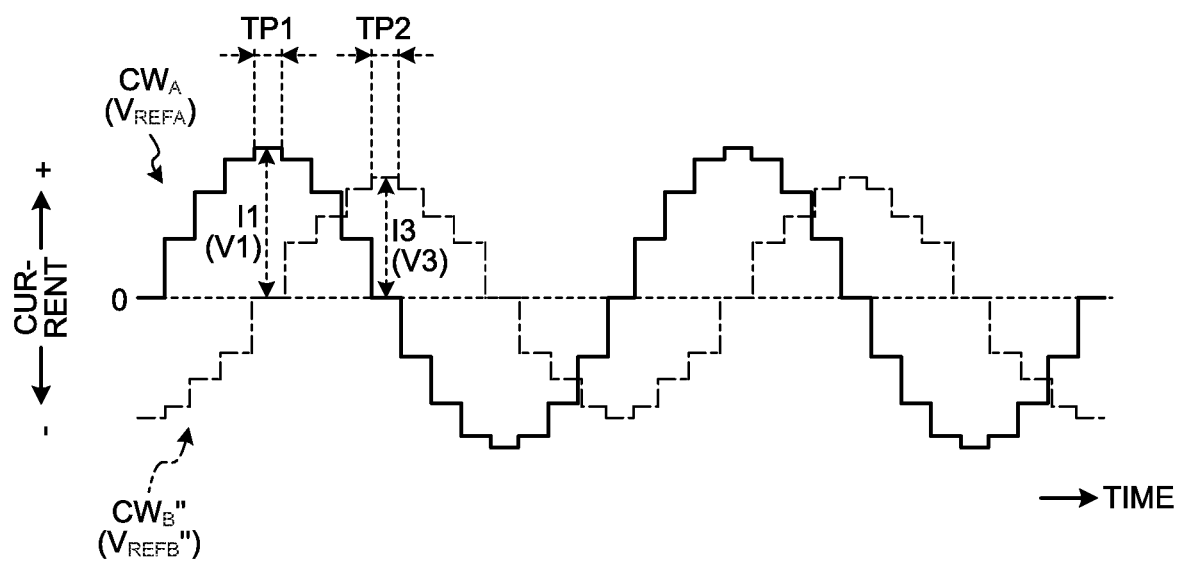

For example, it is assumed that a difference between the parameters $PM_A$ and $PM_B$ with the amplitude control value $V_{REFA}$ maintained is an increasing function with respect to the amplitude control value $V_{REFB}$. In an initial state, as illustrated in FIGS. 2A and 3A, $V_{REFA}=V_{REFB}=V1$ is assumed to be set for periods TP1 and TP2 including the 90° phase timing. When $PM_A>PM_B$ is determined in the detection circuit 20, the correction circuit 30 increases, while maintaining an amplitude control value for a period TP1 at $V_{REFA}=V1$, as illustrated in FIG. 2B, an amplitude control value for a period TP2 to be corrected to $V_{REFB}=V2(>V1)$. When $PM_A<PM_B$ is determined in the detection circuit 20, the correction circuit 30 decreases, while maintaining the amplitude control value for the period TP1 at $V_{REFA}=V1$, as illustrated in FIG. 3B, the amplitude control value for the period TP2 to be corrected to $V_{REFB}=V3(<V1)$.

Alternatively, it is assumed that a difference between the parameters $PM_A$ and $PM_B$ with the amplitude control value $V_{REFA}$ maintained is a decreasing function with respect to the amplitude control value $V_{REFB}$. When $PM_A>PM_B$ is determined in the detection circuit 20, the correction circuit 30 decreases, while maintaining the amplitude control value for the period TP1 at $V_{REFA}=V1$, as illustrated in FIG. 3B, the amplitude control value for the period TP2 to be corrected to $V_{REFB}=V3(<V1)$. Further, when $PM_A<PM_B$ is determined in the detection circuit 20, the correction circuit 30 increases, while maintaining the amplitude control value for the period TP1 at $V_{REFA}=V1$, as illustrated in FIG. 2B, the amplitude control value for the period TP2 to be corrected to $V_{REFB}=V2(>V1)$.

Although FIGS. 2A, 2B, 3A, and 3B exemplifies waveforms when the control device 2 performs micro-step excitation control, the control device 2 is equally applicable in other types of excitation control (e.g., two-phase excitation control and one-two phase excitation control).

The correction circuit 30 supplies the corrected amplitude control values $V_{REFA}$ and $V_{REFB}$ to the drive control circuit 40. The drive control circuit 40 generates, according to the amplitude control values $V_{REFA}$ and $V_{REFB}$, control signals $CS_A$ and $CS_B$ of the A-phase and the B-phase, respectively to be supplied to the drive circuit 10.

The drive circuit 10 supplies, according to the control signals $CS_A$ and $CS_B$, the currents $I_A$ and $I_B$ to the windings $L_A$ and $L_B$, respectively, to drive the DC motor M. For example, when a correction is made so as to increase an amplitude, the drive circuit 10 applies, in the period TP1, the current $I_A$ according to the amplitude control value $V_{REFA}$ (=V1) to the winding $L_A$. In addition, the drive circuit 10 applies, in the period TP2, the current $I_B$ according to the amplitude control value $V_{REFB}$ (=V2) to the winding $L_B$. Alternatively, when a correction is made so as to decrease an amplitude, the drive circuit 10 applies, in the period TP1, the current $I_A$ according to the amplitude control value $V_{REFA}$ (=V1) to the winding $L_A$ and in the period TP2, the current $I_B$ according to the amplitude control value $V_{REFB}$ (=V3) to the winding $L_B$. As a result, in the DC motor M, the windings $L_A$ and $L_B$ are driven so as to cancel variations in angular accuracy.

Here, variations in manufacturing of the DC motor M appear as variations in induced voltage generated when the currents $I_A$ and $I_B$ are supplied. When there are variations in induced voltage, a rate of change when the current flowing through each of the windings $L_A$ and $L_B$ reaches a predetermined value (e.g., a target current value of 90° phase timing in each phase) from substantially zero differs by an influence of the induced voltage. Therefore, the parameters $PM_A$ and $PM_B$ may be times until the current flowing through each of the windings $L_A$ and $L_B$ reaches a predetermined value from substantially zero. In brief, through the time until the current flowing through each of the windings $L_A$ and $L_B$ reaches a predetermined value from substantially zero, variations in induced voltage can be indirectly grasped.

Figure 4:
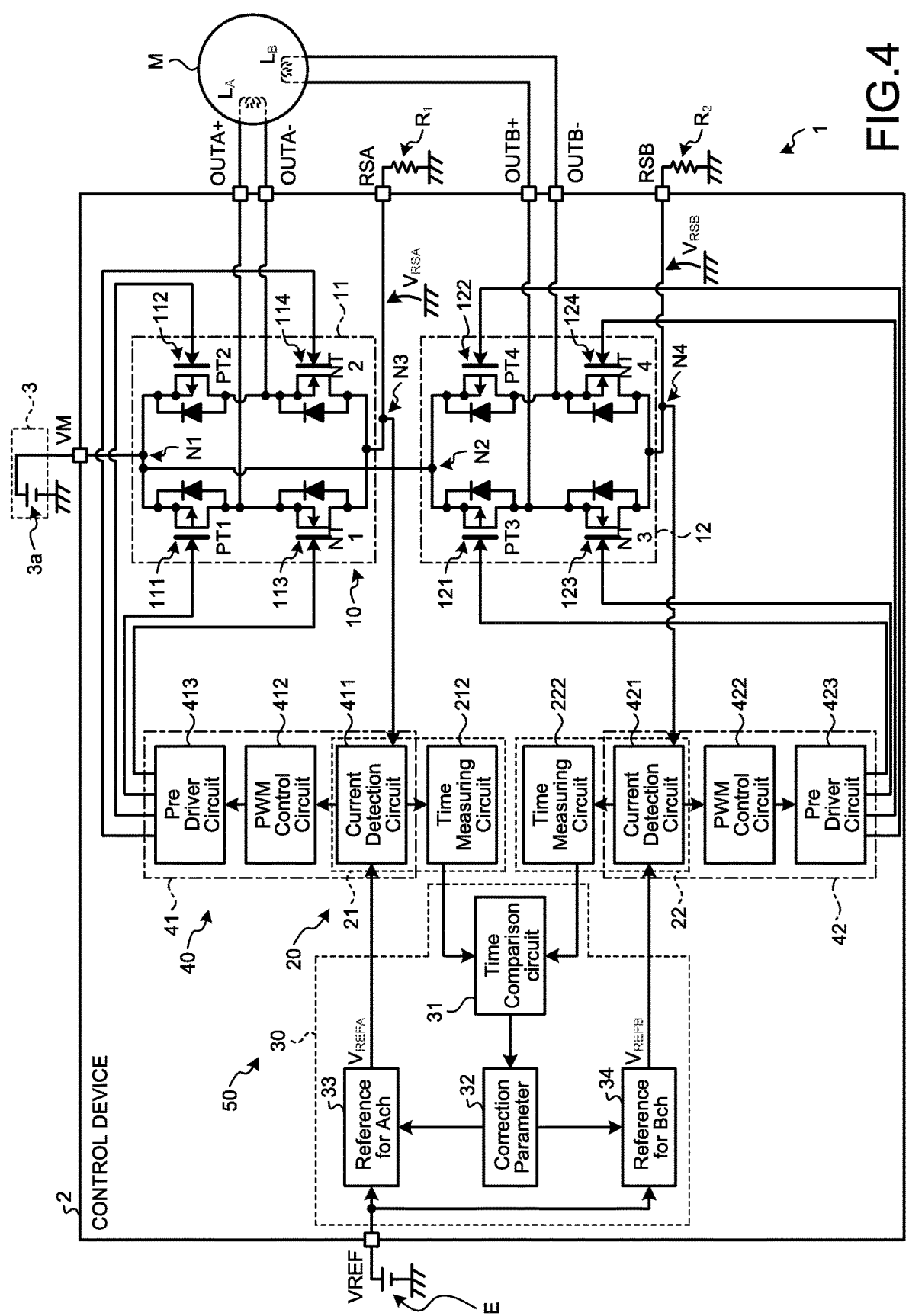
FIG. 4 is a configuration diagram of a control device according to the embodiment.

FIG. 4 is a specific configuration diagram of the control device 2. The drive circuit 10 has an A-phase drive circuit 11 and a B-phase drive circuit 12. The detection circuit 20 has an A-phase detection circuit 21 and a B-phase detection circuit 22. The drive control circuit 40 has an A-phase control circuit 41 and a B-phase control circuit 42.

The A-phase drive circuit 11 is connected to the power supply circuit 3 that supplies a power supply voltage $V_M$ via the terminal VM, the winding $L_A$ via the terminals OUTA+ and OUTA−, and a resistive element R1 via the terminal RSA. The power supply circuit 3 has a power source 3a. One end of the power source 3a is connected to the terminal VM, and the other end is connected to a ground potential. One end of the winding $L_A$ is connected to the terminal OUTA+, and the other end is connected to the terminal OUTA−. The A-phase drive circuit 11 applies the current $I_A$ to the winding $L_A$ via the terminals OUTA+ and OUTA−. One end of the resistive element R1 is connected to the terminal RSA, and the other end is connected to the ground potential. The resistive element R1 detects a current flowing through the winding $L_A$. The resistive element R1 converts the current flowing through the winding $L_A$ into a voltage $V_{RSA}$. The voltage $V_{RSA}$ is a voltage at the terminal RSA and one corresponding to the current flowing through the winding $L_A$.

The A-phase drive circuit 11 has a bridge circuit (e.g., an H bridge circuit) where a plurality of switching elements 111 to 114 is connected between nodes N1 and N3. The node N1 is a node on an input side of the A-phase drive circuit 11 and is connected to the terminal VM. The node N3 is a node on an output side of the A-phase drive circuit 11 and is connected to the terminal RSA.

Each of the switching elements 111 to 114 has a control terminal connected to the A-phase control circuit 41, is turned on/off by a control signal $CS_A$ from the A-phase control circuit 41, and applies the current $I_A$ to the winding $L_A$. The switching elements 111 and 112 constitute upper arms in the bridge circuit and have PMOS transistors PT1 and PT2 and a diode, respectively. The transistors PT1 and PT2 each have a source connected to the node N1, a drain connected to the terminals OUTA+ and OUTA−, and a gate connected to the A-phase control circuit 41. The diode has a cathode connected to the drains of the transistors PT1 and PT2 and an anode connected to the sources of the transistors PT1 and PT2.

Constituting lower arms in the bridge circuit, the switching elements 113 and 114 each have NMOS transistors NT1 and NT2 and a diode. The transistors NT1 and NT2 each have a source connected to the node N3, a drain connected to the terminals OUTA+ and OUTA−, and a gate connected to the A-phase control circuit 41. The diode has a cathode connected to the sources of the transistors NT1 and NT2 and an anode connected to the drains of the transistors NT1 and NT2.

The A-phase control circuit 41 controls a drive of the winding $L_A$ by the A-phase drive circuit 11 according to a result of detecting the current flowing through the winding $L_A$. The A-phase control circuit 41 has a current detection circuit 411, a PWM control circuit 412, and a pre driver circuit 413. The current detection circuit 411 is supplied with the amplitude control value $V_{REFA}$ from the correction circuit 30, detects the voltage $V_{RSA}$ via the node N3, and supplies a difference between the amplitude control value $V_{REFA}$ and the voltage $V_{RSA}$ to the PWM control circuit 412. The PWM control circuit 412 generates, according to the difference between the amplitude control value $V_{REFA}$ and the voltage $V_{RSA}$, a PWM control signal to be supplied to the pre driver circuit 413. The pre driver circuit 413 supplies a control signal generated according to the PWM control signal to the control terminal of each of the switching elements 111 to 114.

Further, the A-phase detection circuit 21 detects time until an amplitude of the voltage $V_{RSA}$ reaches a predetermined value as the parameter $PM_A$. For example, the A-phase detection circuit 21 detects time Ta until the amplitude of the voltage $V_{RSA}$ reaches the amplitude control value $V_{REFA}$ from substantially zero as the parameter $PM_A$.

The A-phase detection circuit 21 has the current detection circuit 411 and a time measuring circuit 212. The current detection circuit 411 is shared by the A-phase control circuit 41 and the A-phase detection circuit 21. The current detection circuit 411 supplies the voltage $V_{RSA}$ to the time measuring circuit 212. In addition, the current detection circuit 411 supplies a result of determination on whether the voltage $V_{RSA}$ has reached the amplitude control value $V_{REFA}$ to the time measuring circuit 212. The time measuring circuit 212 starts measuring time when a value of the voltage $V_{RSA}$ starts increasing from substantially zero and completes measuring time when receiving a result of determination that the voltage $V_{RSA}$ has reached the amplitude control value $V_{REFA}$. For example, the time measuring circuit 212 has a timer and starts a counting operation of the timer when the voltage $V_{RSA}$ starts increasing from substantially zero and completes the counting operation of the timer when receiving a result of determination that the voltage $V_{RSA}$ has reached the amplitude control value $V_{REFA}$. As a result, the time measuring circuit 212 measures the time Ta until the amplitude of the voltage $V_{RSA}$ reaches the amplitude control value $V_{REFA}$ from substantially zero.

The B-phase drive circuit 12 is connected to the power supply circuit 3 via the terminal VM, the winding $L_B$ via the terminal OUTB+ and the terminal OUTB−, and a resistive element R2 via the terminal RSB. One end of the winding $L_B$ is connected to the terminal OUTB+, and the other end is connected to the terminal OUTB−. The B-phase drive circuit 12 applies the current $I_B$ to the winding $L_B$ via the terminals OUTB+ and OUTB−. One end of the resistive element R2 is connected to the terminal RSB, and the other end is connected to the ground potential. The resistive element R2 detects the current flowing through the winding $L_B$. The resistive element R2 converts the current flowing through the winding $L_B$ into a voltage $V_{RSB}$. The voltage $V_{RSB}$ is a voltage at the terminal RSB and one corresponding to the current flowing through the winding $L_B$.

The B-phase drive circuit 12 has a bridge circuit where a plurality of switching elements 121 to 124 is connected between nodes N2 and N4. The node N2 is a node on an input side of the B-phase drive circuit 12 and is connected to the terminal VM. The node N4 is a node on an output side of the B-phase drive circuit 12 and is connected to the terminal RSB.

Each of the switching elements 121 to 124 has a control terminal connected to the B-phase control circuit 42, is turned on/off by a control signal $CS_B$ from the B-phase control circuit 42, and applies the current $I_B$ to the winding $L_B$. The switching elements 121 and 122 constitute upper arms in the bridge circuit and have PMOS transistors PT3 and PT4 and a diode, respectively. The transistors PT3 and PT4 each have a source connected to the node N2, a drain connected to the terminals OUTB+ and OUTB−, and a gate connected to the B-phase control circuit 42. The diode has a cathode connected to the drains of the transistors PT3 and PT4 and an anode connected to the sources of the transistors PT3 and PT4.

The switching elements 123 and 124 constitute lower arms in the bridge circuit and have NMOS transistors NT3 and NT4 and a diode, respectively. The transistors NT3 and NT4 each have a source connected to the node N4, a drain connected to the terminals OUTB+ and OUTB−, and a gate connected to the B-phase control circuit 42. The diode has a cathode connected to the sources of the transistors NT3 and NT4 and an anode connected to the drains of the transistors NT3 and NT4.

The B-phase control circuit 42 controls a drive of the winding $L_B$ by the B-phase drive circuit 12 according to a result of detecting the current flowing through the winding $L_B$. The B-phase control circuit 42 has a current detection circuit 421, a PWM control circuit 422, and a pre driver circuit 423. The current detection circuit 421 is supplied with the amplitude control value $V_{REFB}$ from the correction circuit 30, detects the voltage $V_{RSB}$ via the node N4, and supplies a difference between the amplitude control value $V_{REFB}$ and the voltage $V_{RSB}$ to the PWM control circuit 422. The PWM control circuit 422 generates, according to the difference between the amplitude control value $V_{REFB}$ and the voltage $V_{RSB}$, a PWM control signal to be supplied to the pre driver circuit 423. The pre driver circuit 423 supplies a control signal generated according to the PWM control signal to the control terminal of each of the switching elements 121 to 124.

Further, the B-phase detection circuit 22 detects time until an amplitude of the voltage $V_{RSB}$ reaches a predetermined value as the parameter $PM_B$. For example, the B-phase detection circuit 22 detects time Tb until the amplitude of the voltage $V_{RSB}$ reaches the amplitude control value $V_{REFB}$ from substantially zero as the parameter $PM_B$.

The B-phase detection circuit 22 has the current detection circuit 421 and a time measuring circuit 222. The current detection circuit 421 is shared by the B-phase control circuit 42 and the B-phase detection circuit 22. The current detection circuit 421 supplies the voltage $V_{RSB}$ to the time measuring circuit 222. In addition, the current detection circuit 421 supplies a result of determination on whether the voltage $V_{RSB}$ has reached the amplitude control value $V_{REFB}$ to the time measuring circuit 222. The time measuring circuit 222 starts measuring time when a value of the voltage $V_{RSB}$ starts increasing from substantially zero and completes measuring time when receiving a result of determination that the voltage $V_{RSB}$ has reached the amplitude control value $V_{REFB}$. For example, the time measuring circuit 222 has a timer and starts a counting operation of the timer when the voltage $V_{RSB}$ starts increasing from substantially zero and completes the counting operation of the timer when receiving a result of determination that the voltage $V_{RSB}$ has reached the amplitude control value $V_{REFB}$. As a result, the time measuring circuit 222 measures the time Tb until the amplitude of the voltage $V_{RSB}$ reaches the amplitude control value $V_{REFB}$ from substantially zero.

Figure 5A:
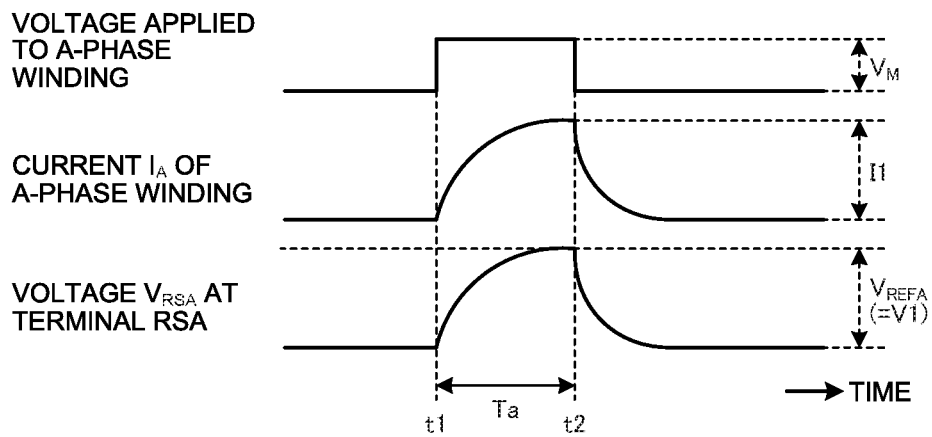
FIGS. 5A to 5C are waveform diagrams illustrating a parameter determining operation according to the embodiment.

FIG. 5A is a waveform diagram illustrating a parameter determining operation of the A-phase by the control circuit 50 and exemplifies an operation when first time until the amplitude of the voltage $V_{RSA}$ reaches a predetermined value (target current I1) is detected as a first parameter. At a timing t1, the A-phase drive circuit 11 selectively turns on the switching elements 111 and 114. As a result, a voltage substantially equal to the power supply voltage $V_M$ is applied to the winding $L_A$, the current flowing through the winding $L_A$ increases from substantially zero, and the voltage $V_{RSA}$ increases from substantially zero. The time measuring circuit 212 starts measuring time. At a timing t2, when the current flowing through the winding $L_A$ reaches the target current I1, the voltage $V_{RSA}$ reaches the amplitude control value $V_{REFA}$ corresponding thereto. In response, the time measuring circuit 212 completes measuring time and supplies the measured time Ta to the correction circuit 30.

Figure 5B:
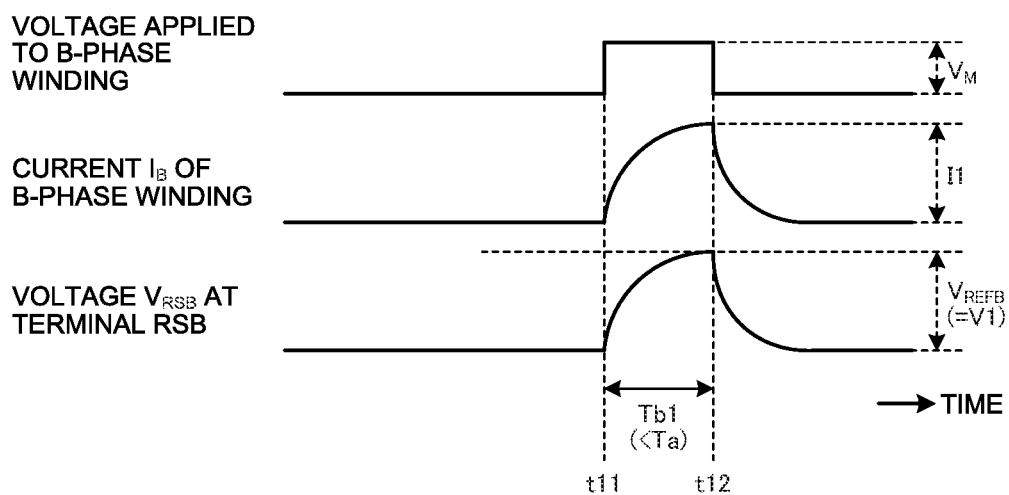
Figure 5C:
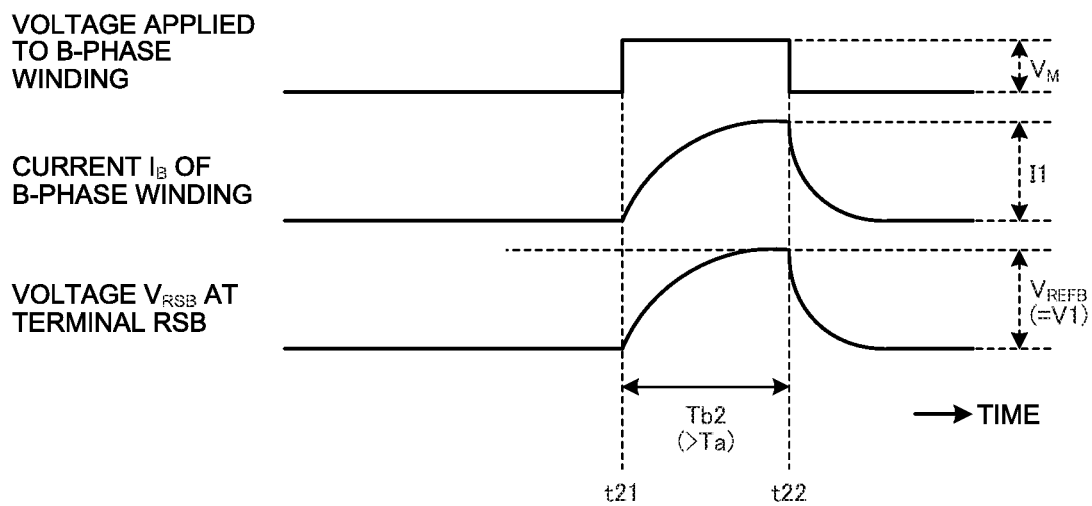

FIGS. 5B and 5C are waveform diagrams illustrating a parameter determining operation of the B-phase by the control circuit 50 and exemplifies an operation when second time until the amplitude of the voltage $V_{RSB}$ reaches a predetermined value is detected as the parameter $PM_B$. FIG. 5B exemplifies a case where time Tb1 is shorter than the time Ta. At a timing t11, the B-phase drive circuit 12 selectively turns on the switching elements 121 and 124. As a result, a voltage substantially equal to the power supply voltage $V_M$ is applied to the winding $L_B$, the current flowing through the winding $L_B$ increases from substantially zero, and the voltage $V_{RSB}$ increases from substantially zero. The time measuring circuit 222 starts measuring time. At a timing t12, when the current flowing through the winding $L_B$ reaches the target current I1, the voltage $V_{RSB}$ reaches the amplitude control value $V_{REFB}$ corresponding thereto. In response, the time measuring circuit 222 completes measuring time and supplies the measured time Tb1 to the correction circuit 30.

FIG. 5C exemplifies a case where time Tb2 is longer than the time Ta. At a timing t21, the B-phase drive circuit 12 selectively turns on the switching elements 121 and 124. As a result, a voltage substantially equal to the power supply voltage $V_M$ is applied to the winding $L_B$, the current flowing through the winding $L_B$ increases from substantially zero, and the voltage $V_{RSB}$ increases from substantially zero. The time measuring circuit 222 starts measuring time. At a timing t22, when the current flowing through the winding $L_B$ reaches the target current I1, the voltage $V_{RSB}$ reaches the amplitude control value $V_{REFB}$ corresponding thereto. In response, the time measuring circuit 222 completes measuring time and supplies the measured time Tb2 to the correction circuit 30.

The correction circuit 30 is connected to the voltage source E that supplies the reference voltage $V_{REF}$ via the terminal VREF. One end of the voltage source E is connected to the terminal VREF, and the other end is connected to the ground potential. The correction circuit 30 has a time comparison circuit 31, a correction parameter generation circuit 32, a reference for Ach correction circuit 33, and a reference for Bch correction circuit 34.

The time comparison circuit 31 is supplied with the time Ta from the time measuring circuit 212 and the time Tb from the time measuring circuit 222. The time comparison circuit 31 supplies a result of comparing the times Ta and Tb to the correction parameter generation circuit 32. In the correction parameter generation circuit 32, correction parameters, or a plurality of current correction amount candidates, are set in advance. The current correction amount candidates include, for example, correction amounts "0%", "+1%", and "−1%". The correction parameter generation circuit 32 selects and sets, according to the comparison result, correction parameters of the A and the B-phases from among the current correction amount candidates.

When performing control based on the A-phase, the correction parameter generation circuit 32 may generate, while maintaining the amplitude control value $V_{REFA}$, correction parameters so as to correct the amplitude control value $V_{REFB}$ in a direction where a time difference between the times Ta and Tb decreases.

For example, in a case of FIG. 5B, the time comparison circuit 31 supplies a comparison result of Tb1<Ta to the correction parameter generation circuit 32. The correction parameter generation circuit 32 supplies a correction parameter for maintaining a current of the A-phase (correction amount "0%") to the reference for Ach correction circuit 33. Further, the correction parameter generation circuit 32 supplies, in response to Tb1<Ta, a correction parameter for increasing a current of the B-phase by a predetermined ratio (correction amount "+1%") to the reference for Bch correction circuit 34. As a result, the reference for Ach correction circuit 33 supplies the amplitude control value $V_{REFA}$ while being maintained to the current detection circuit 411. On the other hand, the reference for Bch correction circuit 34 increases, so as to increase the current of the B-phase by a predetermined ratio (+1%), the amplitude control value $V_{REFB}$ to be supplied to the current detection circuit 421.

Alternatively, in a case of FIG. 5C, the time comparison circuit 31 supplies a comparison result of Tb2>Ta to the correction parameter generation circuit 32. The correction parameter generation circuit 32 supplies, in response to Tb2>Ta, a correction parameter for decreasing the current of the B-phase by a predetermined ratio (correction amount "−1%") to the reference for Bch correction circuit 34. As a result, the reference for Bch correction circuit 34 increases, so as to decrease the current of the B-phase by a predetermined ratio (−1%), the amplitude control value $V_{REFB}$ to be supplied to the current detection circuit 411.

Consequently, the current detection circuits 411 and 421 supply differences between the corrected amplitude control values $V_{REFA}$ and $V_{REFB}$ and the voltages $V_{RSA}$ and $V_{RSB}$ to the PWM control circuits 412 and 422, which generate, according to the differences, the PWM control signals to be supplied to the pre driver circuits 413 and 423. The pre driver circuits 413 and 423 each supply, according to the PWM control signals, the generated control signal to the control terminal of each of the switching elements 111 to 114 and 121 to 124. This drives the windings $L_A$ and $L_B$ of the DC motor M with the amplitudes of the target currents of the windings $L_A$ and $L_B$ unbalanced in the direction where the time difference between the times Ta and Tb decreases.

As described above, in the embodiment, in the motor control system 1, the amplitude control values of the currents of the multiphase windings are set to be mutually unbalanced so as to cancel a difference between multiple phases with respect to the parameters related to the induced voltages of the windings. For example, the amplitude control values $V_{REFA}$ and $V_{REFB}$ are set to be unbalanced in a direction where the time difference between the time Ta until the current flowing through the winding $L_A$ reaches a predetermined value from substantially zero and the time Tb until the current flowing through the winding $L_B$ reaches a predetermined value from substantially zero decreases. This can offset, without using an encoder device, the influence of the variations in angular accuracy due to variations in manufacturing of the DC motor M. As a result, smooth rotation of the DC motor M can be obtained, and motor vibration/drive noise can be suppressed. Therefore, in the motor control system 1, the influence of the variations in manufacturing can be suppressed while suppressing the cost increase.

It should be noted that, instead of increasing or decreasing the amplitude control value $V_{REFB}$ while maintaining the amplitude control value $V_{REFA}$, a correction amount may be divided to increase or decrease the amplitude control values $V_{REFA}$ and $V_{REFB}$, respectively. When Tb<Ta, the correction parameter generation circuit 32 makes a correction to increase the amplitude control value $V_{REFB}$ relative to the amplitude control value $V_{REFA}$ by a desired ratio (e.g., correction of +10%). The correction parameter generation circuit 32 generates a correction parameter for decreasing the current of the A-phase by a predetermined ratio (e.g., correction amount "−5%") and a correction parameter for increasing the current of the B-phase by a predetermined ratio (e.g., correction amount "+5%"). This can increase the amplitude control value $V_{REFB}$ relative to the amplitude control value $V_{REFA}$ by a desired ratio.

Alternatively, when Tb>Ta, the correction parameter generation circuit 32 makes a correction to decrease the amplitude control value $V_{REFB}$ relative to the amplitude control value $V_{REFA}$ by a desired ratio (e.g., correction of −10%). The correction parameter generation circuit 32 generates a correction parameter for increasing the current of the A-phase by a predetermined ratio (e.g., correction amount "+5%") and a correction parameter for decreasing the current of the B-phase by a predetermined ratio (e.g., correction amount "−5%"). This can decrease the amplitude control value $V_{REFB}$ relative to the amplitude control value $V_{REFA}$ by a desired ratio.

Figure 6:
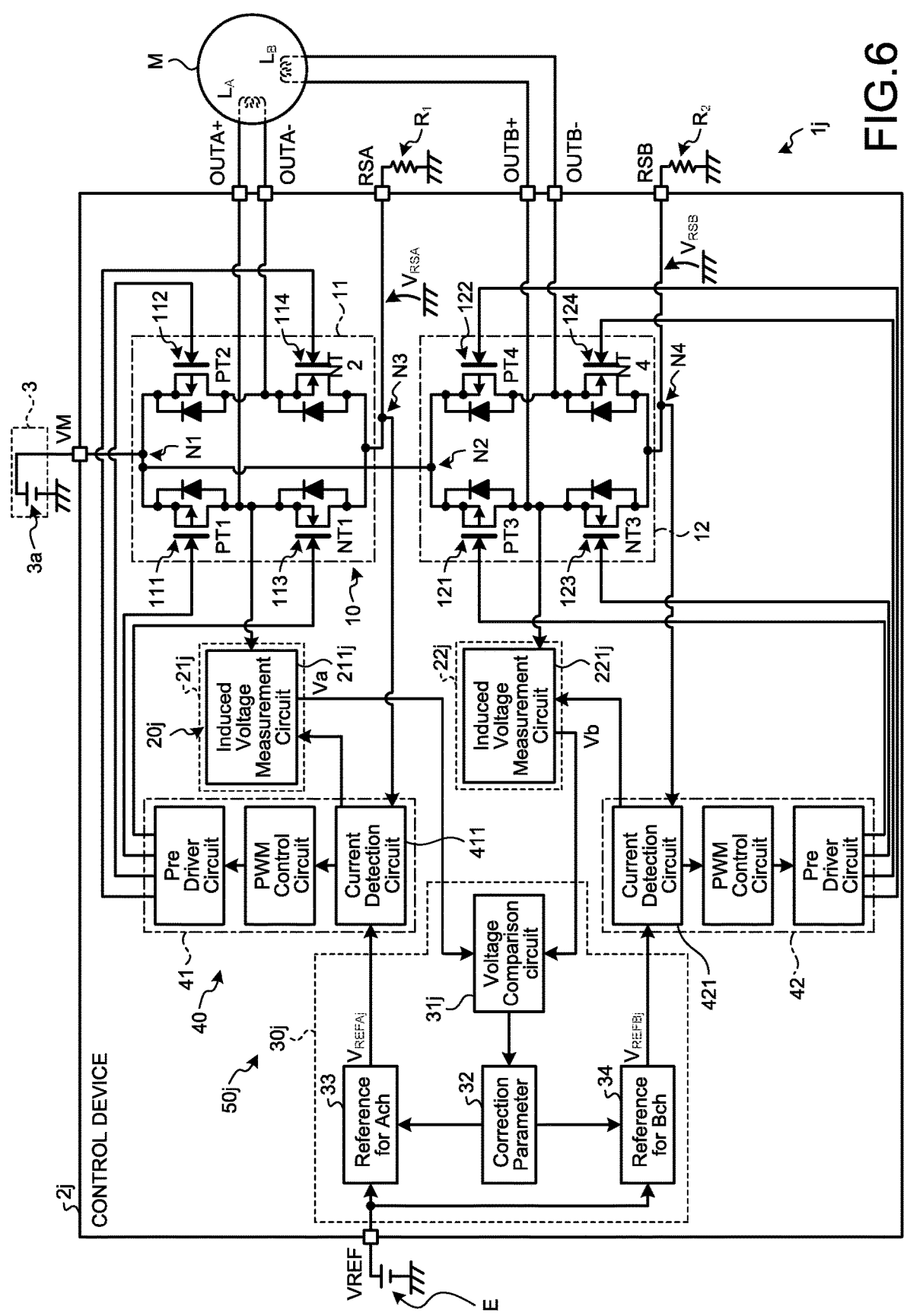
FIG. 6 is a configuration diagram of a control device according to a modification of the embodiment.

Alternatively, when driving the DC motor M by excitation control that can sufficiently secure a period when the target current is substantially zero (e.g., one-two phase excitation control), during a period when the target currents of the windings $L_A$ and $L_B$ are substantially zero, no voltage is applied to the windings $L_A$ and $L_B$, and thus the induced voltages can be measured. Variations in induced voltage may be measured directly instead of indirectly. FIG. 6 is a configuration diagram of a control device 2j according to a modification of the embodiment. The control device 2j has a detection circuit 20j and a control circuit 50j in place of the detection circuit 20 and the control circuit 50. The control circuit 50j has a correction circuit 30j and a drive control circuit 40j.

The detection circuit 20j has an A-phase detection circuit 21j and a B-phase detection circuit 22j. The A-phase detection circuit 21j is connected to the terminal OUTA+ and detects an induced voltage generated during a period when the target current of the winding $L_A$ is substantially zero as the parameter $PM_A$. For example, the A-phase detection circuit 21j detects, according to information indicating that the target current of the winding $L_A$ is substantially zero, a voltage generated in the winding $L_A$ as the parameter $PM_A$.

The A-phase detection circuit 21j has an induced voltage measuring circuit 211j. The induced voltage measuring circuit 211j measures, upon receiving from the current detection circuit 411 a determination result indicating that the target current of the winding $L_A$ is substantially zero, a voltage Va generated in the winding $L_A$ as an induced voltage.

The B-phase detection circuit 22j is connected to the terminal OUTB+ and detects an induced voltage generated during a period when the target current of the winding $L_B$ is substantially zero as the parameter $PM_B$. For example, the B-phase detection circuit 22j detects, according to information indicating that the target current of the winding $L_B$ is substantially zero, a voltage generated in the winding $L_B$ as the parameter $PM_B$.

The B-phase detection circuit 22j has an induced voltage measuring circuit 221j. The induced voltage measuring circuit 221j measures, upon receiving from the current detection circuit 421 a determination result indicating that the target current of the winding $L_B$ is substantially zero, a voltage Vb generated in the winding $L_B$ as an induced voltage.

Figure 7A:
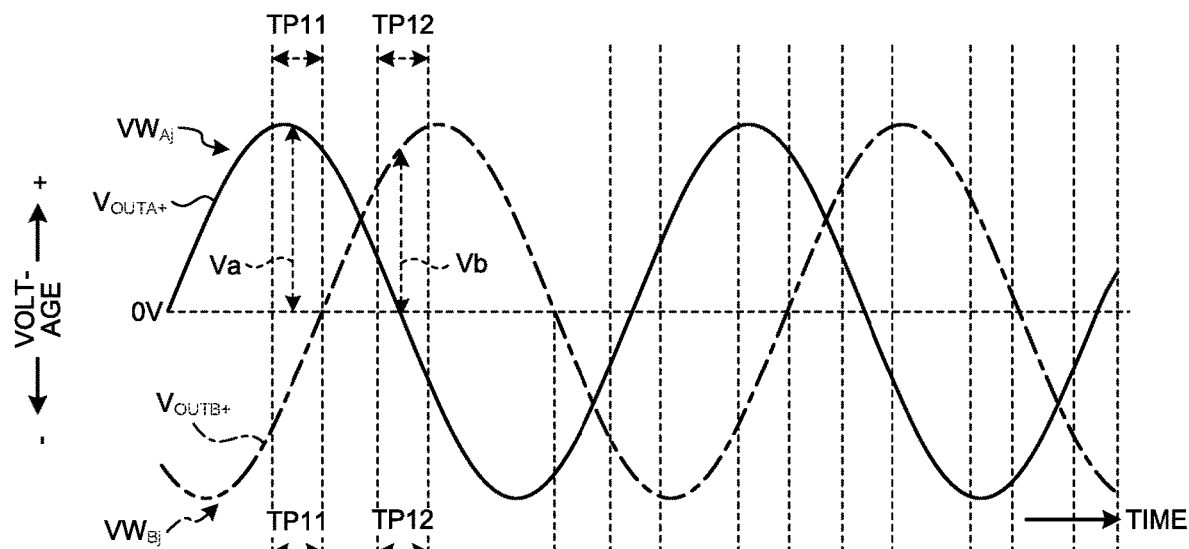
FIGS. 7A and 7B are waveform diagrams illustrating a parameter determining operation according to the modification of the embodiment.
Figure 7B:
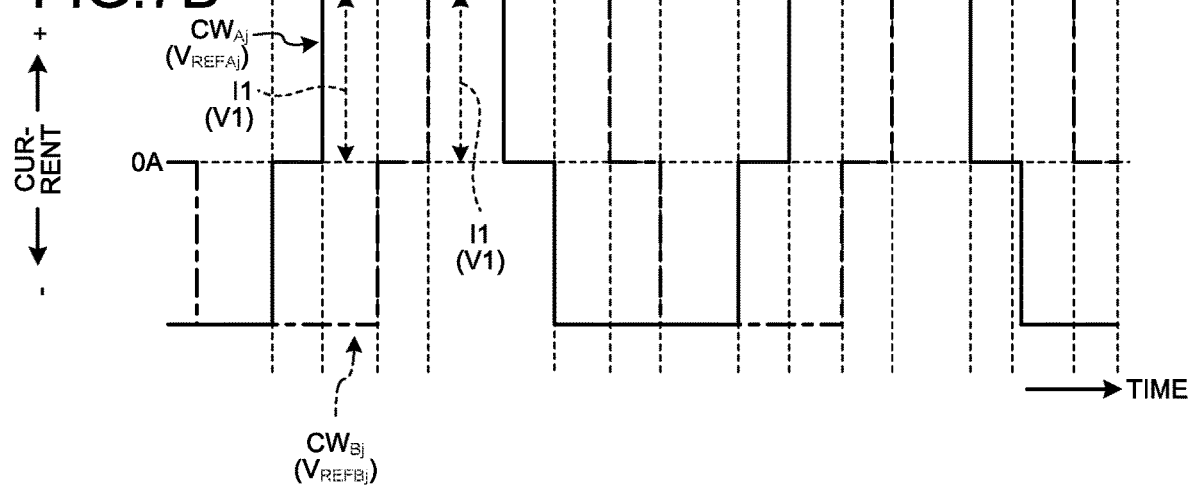

FIGS. 7A and 7B are waveform diagrams illustrating a parameter determining operation according to the modification of the embodiment. FIG. 7A exemplifies a case where voltage waveform patterns $VW_Aj$ and $VW_Bj$ of changes in induced voltage are sinusoidal. FIG. 7B exemplifies a case where control waveform patterns $CW_Aj$ and $CW_Bj$ are control waveform patterns according to one-two phase excitation. When driving the winding $L_A$ in the control waveform pattern $CW_Aj$, an induced voltage that changes in the voltage waveform pattern $VW_Aj$ is generated in the winding $L_A$. Further, when driving the winding $L_B$ in the control waveform pattern $CW_Bj$, an induced voltage that changes in the voltage waveform pattern $VW_Bj$ is generated in the winding $L_B$. Other control waveform patterns may be used as long as they can ensure a period of time when a target current is substantially zero with a sufficient length for voltage measurement. Additionally, changes in induced voltage may indicate other voltage waveform patterns.

At a timing of starting a period TP11 when a target current in the control waveform pattern $CW_A j$ is substantially zero, the A-phase drive circuit 11 turns off the switching elements 111 to 114. As a result, the winding $L_A$ is substantially in a state where no voltage is applied, and an induced voltage Va generated in the winding $L_A$ appears at the terminal OUTA+. The induced voltage measuring circuit 211j starts measuring the voltage Va appearing at the terminal OUTA+. At a timing of ending the period TP11, the induced voltage measuring circuit 211j supplies the voltage Va appearing at the terminal OUTA+ to the correction circuit 30j.

At a timing of starting a period TP12 when a target current in the control waveform pattern $CW_B j$ is substantially zero, the B-phase drive circuit 12 turns off the switching elements 121 to 124. As a result, the winding $L_B$ is substantially in a state where no voltage is applied, and an induced voltage Vb generated in the winding $L_B$ appears at the terminal OUTB+. The induced voltage measuring circuit 221j starts measuring the voltage Vb appearing at the terminal OUTB+. At a timing of ending the period TP12, the induced voltage measuring circuit 221j supplies the voltage Vb appearing at the terminal OUTB+ to the correction circuit 30j.

The correction circuit 30j has a voltage comparison circuit 31j in place of the time comparison circuit 31. The voltage comparison circuit 31j supplies a result of comparing the voltages Va and Vb to the correction parameter generation circuit 32. The correction parameter generation circuit 32 selects and sets, according to the comparison result, current correction amounts of the A-phase and the B-phase from among the current correction amount candidates.

When performing control based on the A phase, the correction parameter generation circuit 32 may generate, while maintaining the amplitude control value $V_{REFA}$, correction parameters so as to correct the amplitude control value $V_{REFB}$ in a direction where a voltage difference between the voltages Va and Vb decreases. Consequently, the reference for Ach correction circuit 33 maintains the amplitude control value $V_{REFA}$ to be supplied to the current detection circuit 411. The reference for Bch correction circuit 34 increases the amplitude control value $V_{REFB}$ so as to increase the current of the B-phase by a predetermined ratio (e.g., 1%) to be supplied to the current detection circuit 421. As a result, the windings $L_A$ and $L_B$ are driven with the amplitudes of the target currents of the windings $L_A$ and $L_B$ unbalanced in the direction where the voltage difference between the voltages Va and Vb decreases.

In this way, in the motor control system 1j, the amplitude control values $V_{REFA}$ and $V_{REFB}$ of the target currents are set to be unbalanced in a direction where a difference between the voltages generated in the windings $L_A$ and $L_B$ decreases during the period when the target currents are substantially zero. This also makes it possible to offset, without using an encoder device, the influence of the variations in angular accuracy due to the variations in manufacturing of the DC motor M.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A motor control device comprising: a detection circuit that detects, in a direct current motor with a first coil and second coil, a first parameter related to an induced voltage generated in the first coil and a second parameter related to an induced voltage generated in the second coil; a control circuit that changes, according to a difference between the first parameter and the second parameter, at least one of a first amplitude control value of a current of the first coil and a second amplitude control value of a current of the second coil; and a drive circuit that drives, according to the changed amplitude control value, the first coil and the second coil, respectively; wherein the control circuit changes, according to a difference between the first parameter and the second parameter, the second amplitude control value while maintaining the first amplitude control value; wherein the control circuit increases, when the first parameter is larger than the second parameter, the second amplitude control value while maintaining the first amplitude control value and decreases, when the first parameter is smaller than the second parameter, the second amplitude control value while maintaining the first amplitude control value.

2. The motor control device according to claim 1, wherein the control circuit changes at least one of the first amplitude control value and the second amplitude control value so as to unbalance an amplitude of a target current of the first coil and an amplitude of a target current of the second coil with each other.

3. The motor control device according to claim 1, wherein the control circuit decreases, when the first parameter is larger than the second parameter, the second amplitude control value while maintaining the first amplitude control value and increases, when the first parameter is smaller than the second parameter, the second amplitude control value while maintaining the first amplitude control value.

4. The motor control device according to claim 1, wherein the control circuit changes, in a direction where a difference between the first parameter and the second parameter decreases, at least one of the first amplitude control value and the second amplitude control value.

5. The motor control device according to claim 4, wherein the control circuit increases, when the first parameter is larger than the second parameter, the second amplitude control value while maintaining the first amplitude control value and decreases, when the first parameter is smaller than the second parameter, the second amplitude control value while maintaining the first amplitude control value.

6. The motor control device according to claim 4, wherein the control circuit decreases, when the first parameter is larger than the second parameter, the second amplitude control value while maintaining the first amplitude control value and increases, when the first parameter is smaller than the second parameter, the second amplitude control value while maintaining the first amplitude control value.

7. The motor control device according to claim 1, wherein the detection circuit detects first time until a current flowing through the first coil reaches a predetermined value during a first period as the first parameter and second time until a current flowing through the second coil reaches the predetermined value during a second period corresponding to the first period as the second parameter, and the control circuit changes, according to a time difference between the first time and the second time, at least one of the first amplitude control value and the second amplitude control value.

8. The motor control device according to claim 7, wherein the control circuit changes, in a direction where the time difference decreases, at least one of the first amplitude control value and the second amplitude control value.

9. The motor control device according to claim 8, wherein the control circuit increases, when the first time is longer than the second time, the second amplitude control value while maintaining the first amplitude control value and decreases, when the first time is shorter than the second time, the second amplitude control value while maintaining the first amplitude control value.

10. The motor control device according to claim 8, wherein
the control circuit decreases, when the first time is longer than the second time, the second amplitude control value while maintaining the first amplitude control value and increases, when the first time is shorter than the second time, the second amplitude control value while maintaining the first amplitude control value.

11. The motor control device according to claim 1, wherein
the detection circuit detects a first voltage generated in the first coil during a first period in which a target current of the first coil is substantially zero as the first parameter and detects a second voltage generated in the second coil during a second period in which a target current of the second coil is substantially zero as the second parameter, and
the control circuit changes, according to a voltage difference between the first voltage and the second voltage, at least one of the first amplitude control value and the second amplitude control value.

12. The motor control device according to claim 11, wherein
the control circuit changes, in a direction where the voltage difference decreases, at least one of the first amplitude control value and the second amplitude control value.

13. The motor control device according to claim 12, wherein
the control circuit increases, when the first voltage is larger than the second voltage, the second amplitude control value while maintaining the first amplitude control value and decreases, when the first voltage is smaller than the second voltage, the second amplitude control value while maintaining the first amplitude control value.

14. The motor control device according to claim 12, wherein
the control circuit decreases, when the first voltage is larger than the second voltage, the second amplitude control value while maintaining the first amplitude control value and increases, when the first voltage is smaller than the second voltage, the second amplitude control value while maintaining the first amplitude control value.

15. A motor control method comprising: detecting, in a direct current motor with a first coil and second coil, a first parameter related to an induced voltage generated in the first coil and a second parameter related to an induced voltage generated in the second coil; changing, according to a difference between the first parameter and the second parameter, at least one of an amplitude control value of a current of the first coil and an amplitude control value of a current of the second coil; and driving, according to the changed amplitude control value, the first coil and the second coil; wherein the changing includes changing, according to a difference between the first parameter and the second parameter, the second amplitude control value while maintaining the first amplitude control value; and wherein the changing includes changing at least one of the first amplitude control value and the second amplitude control value in a direction where a difference between the first parameter and the second parameter decreases.

16. The motor control method according to claim 15, wherein
the changing includes changing at least one of the first amplitude control value and the second amplitude control value so as to unbalance an amplitude of a target current of the first coil and an amplitude of a target current of the second coil with each other.

* * * * *